United States Patent
Fang et al.

(10) Patent No.: US 9,711,624 B1
(45) Date of Patent: Jul. 18, 2017

(54) METHODS FOR DIRECT MEASUREMENT OF PITCH-WALKING IN LITHOGRAPHIC MULTIPLE PATTERNING

(71) Applicant: GLOBALFOUNDRIES Inc., Grand Cayman (KY)

(72) Inventors: Fang Fang, Clifton Park, NY (US); Daniel Jaeger, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/074,235

(22) Filed: Mar. 18, 2016

(51) Int. Cl.
| | |
|---|---|
| *H01L 23/58* | (2006.01) |
| *H01L 29/66* | (2006.01) |
| *H01L 21/66* | (2006.01) |
| *H01L 21/3065* | (2006.01) |
| *H01L 21/308* | (2006.01) |
| *H01L 29/78* | (2006.01) |

(52) U.S. Cl.
CPC ........ *H01L 29/6681* (2013.01); *H01L 21/308* (2013.01); *H01L 21/3065* (2013.01); *H01L 22/12* (2013.01); *H01L 22/20* (2013.01); *H01L 29/7851* (2013.01)

(58) Field of Classification Search
CPC .......................... H01L 21/308; H01L 21/3065
See application file for complete search history.

(56) References Cited

U.S. PATENT DOCUMENTS

| | | |
|---|---|---|
| 7,368,208 B1 | 5/2008 | Adel et al. |
| 2012/0072875 A1 | 3/2012 | Ghosh et al. |
| 2013/0074024 A1 | 3/2013 | Chase et al. |

FOREIGN PATENT DOCUMENTS

WO   2015109036 A1   7/2015

*Primary Examiner* — Marc Armand
*Assistant Examiner* — Sarah Salerno
(74) *Attorney, Agent, or Firm* — Ditthavong & Steiner, P.C.

(57) ABSTRACT

Methods and apparatus for measuring pitch-walking are disclosed. Embodiments include forming parallel, spaced mandrels in test sites on a substrate; performing two SIT processes, forming first-fourth fins in the substrate for each mandrel; designating spaces between first and second and between third and fourth fins as β, between first and fourth fins of adjacent mandrels as α, and between second and third fins as γ in each test site; applying a first lithomask over fins at a first test site selecting spaces designated as one of α, β, or γ and the adjacent fins; applying a second lithomask over fins at a second test site selecting second spaces, designated as a different one of α, β, or γ and the adjacent fins; measuring the selected first and second spaces; determining differences between the measured first and second spaces; and adjusting processes for forming fins based on the differences.

20 Claims, 11 Drawing Sheets

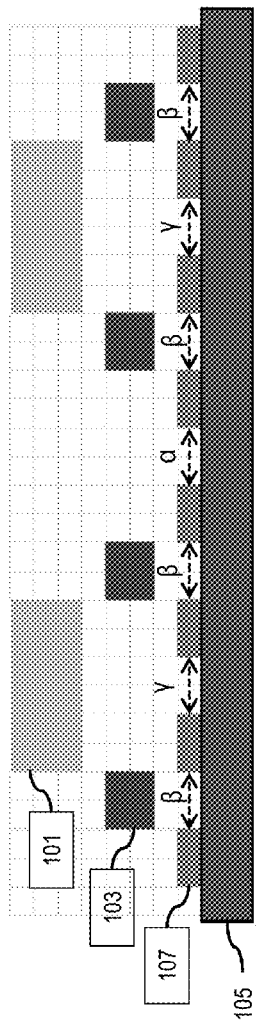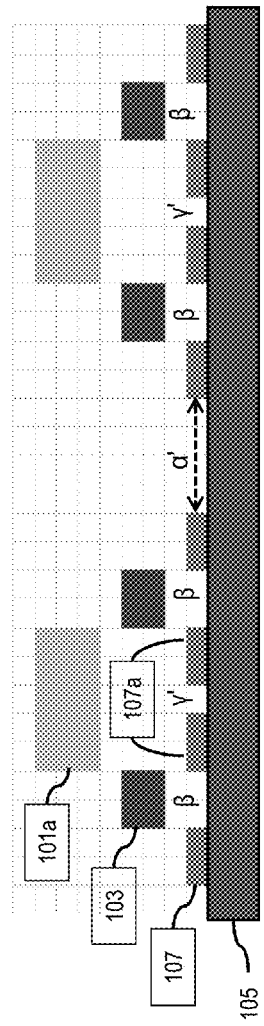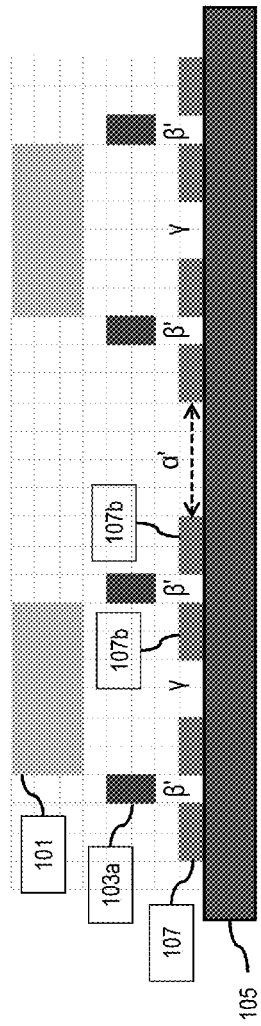
FIG. 1A Background
FIG. 1B Background
FIG. 1C Background

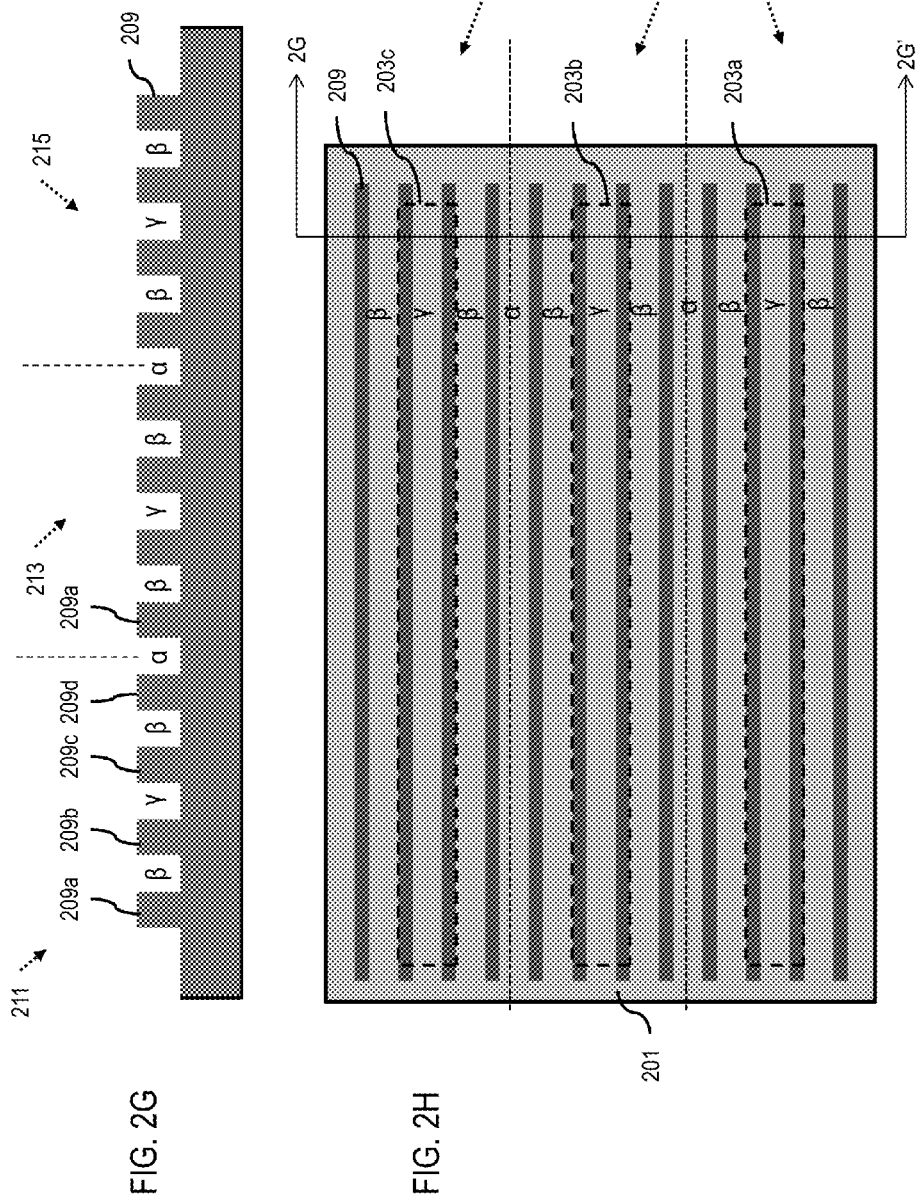

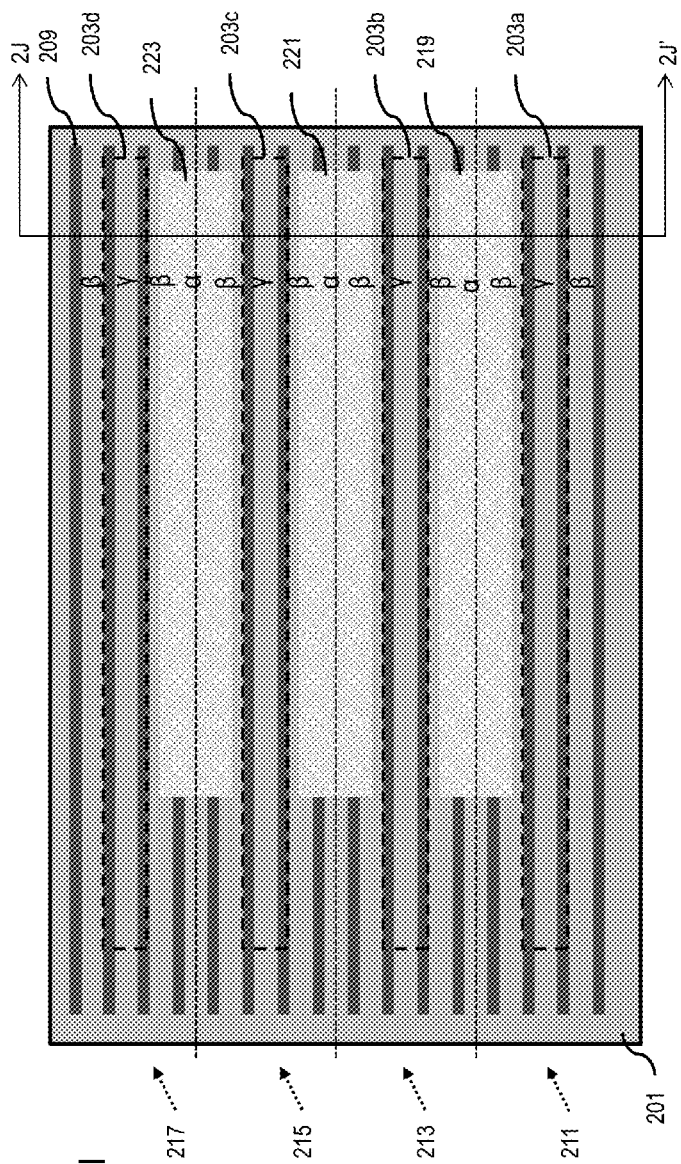
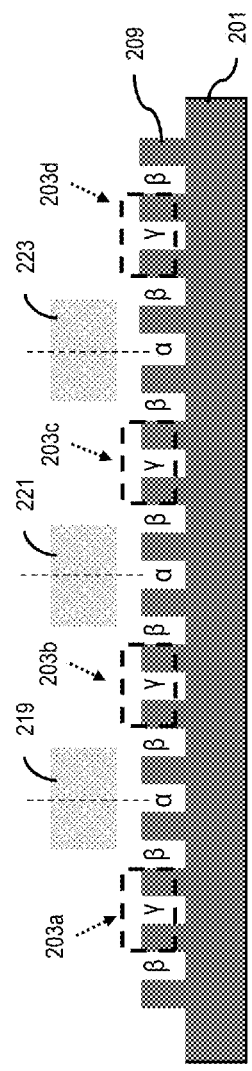
FIG. 2I
FIG. 2J

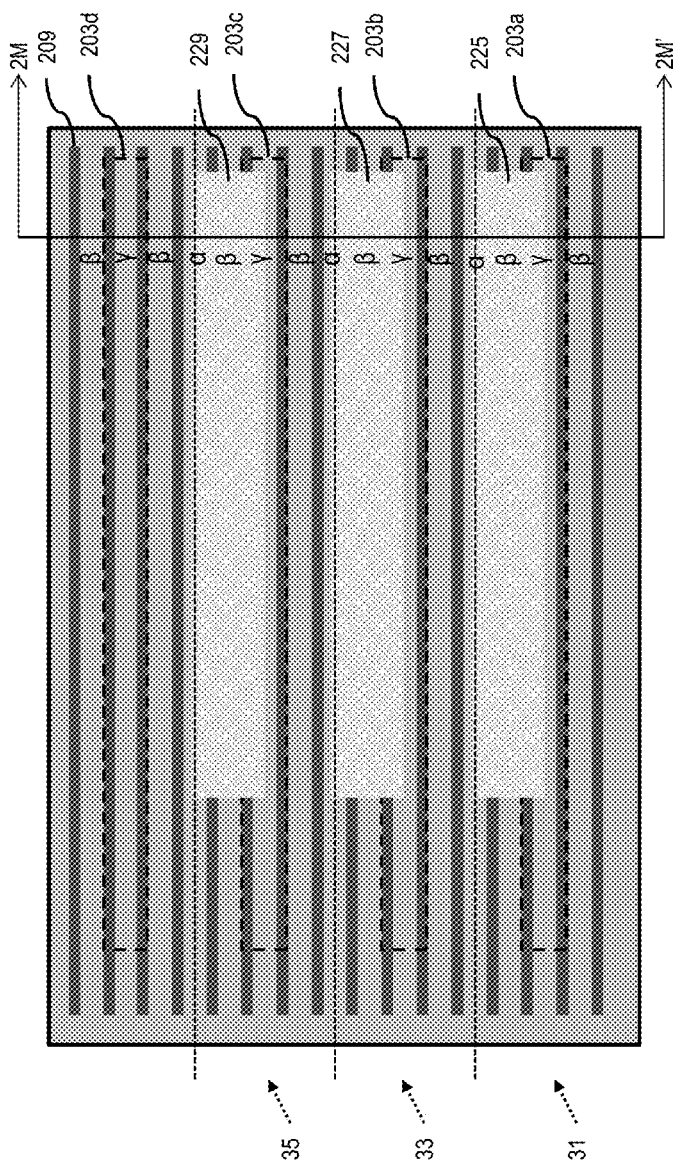
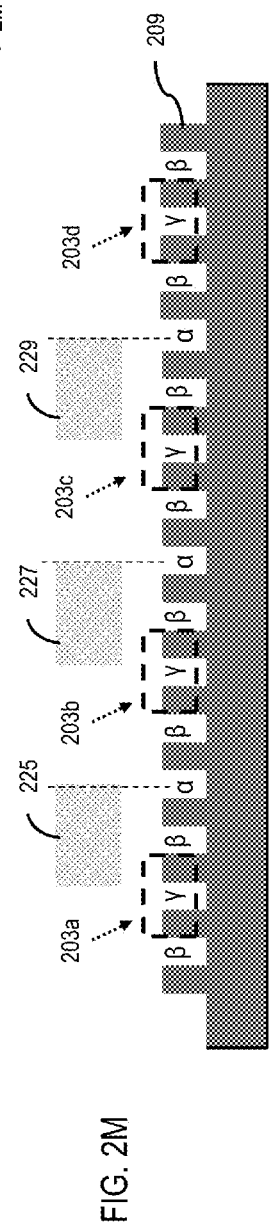
FIG. 2L
FIG. 2M

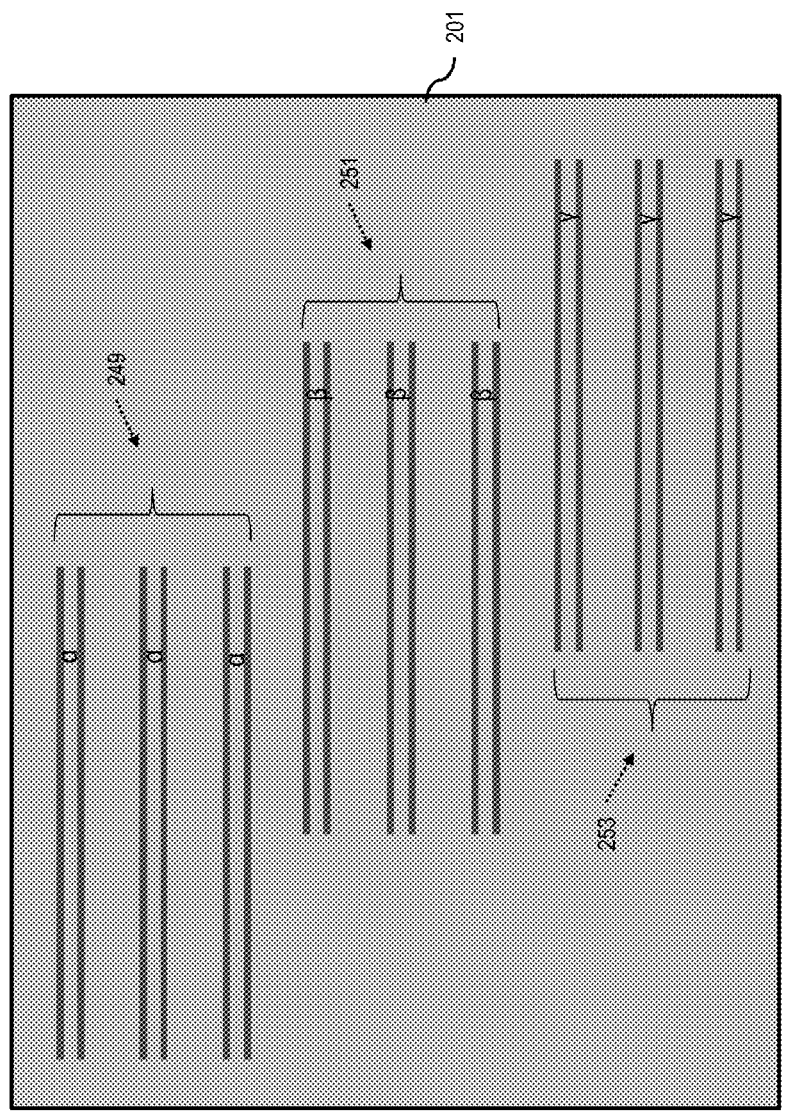

METHODS FOR DIRECT MEASUREMENT OF PITCH-WALKING IN LITHOGRAPHIC MULTIPLE PATTERNING

TECHNICAL FIELD

The present disclosure relates generally to designing and fabricating integrated circuit (IC) devices. The present disclosure is particularly applicable to direct measuring of errors in multiple patterning lithography processes utilized in fabrication of semiconductor devices.

BACKGROUND

Advanced semiconductor fabrication processes include utilization of multiple patterning techniques, for example, litho-etch-litho-etch (LELE) with double photomasks/lithomasks (mask) where each mask may be used to pattern half of the target pitch, self-aligned double-patterning (SADP) or self-aligned quadruple-patterning (SAQP). However, variations in a multiple patterning process can affect results of the reproduced pattern where, for example, some features of the pattern may be formed or placed inaccurately when compared to the original target pattern. Variations in spacing between elements, termed "pitch-walking," may be triggered by multiple root causes such as litho offsets, spacer deposition uniformity, etch bias, or the combination thereof, which impacts features (e.g., mandrels, spacers, etc.) used in forming elements (e.g. silicon (Si) fins) of an integrated circuit.

FIG. 1A illustrates an example SAQP process for forming fin features in a substrate. Mandrels 101 and first spacers 103 formed on opposite sides thereof may be formed on an upper surface of a substrate 105. Next, the mandrels may be removed, second spacers 107 may be formed at opposite sides of the first spacers, and then the first spacers may be removed. The fin features are formed by removing sections of the substrate in the spaces between second spacers 107. As noted, errors in placement and/or a size of any of these features can produce a pitch-walking error affecting the final formed elements. FIG. 1A illustrates spaces "$\alpha$", "$\beta$", and "$\gamma$", which have substantially the same size, $\alpha=\beta=\gamma$, resulting in no pitch-walking.

In contrast, FIGS. 1B and 1C illustrate instances of pitch-walking. In FIG. 1B, $\alpha'\neq\beta\neq\gamma'$ resulting in a pitch-walking error where $\alpha'$ is greater than $\beta$ and $\gamma'$, and $\beta$ is greater than $\gamma'$. The resulting pitch-walking error can be contributed to different size mandrels 101a when compared to the mandrels 101 in FIG. 1A. Although elements (e.g. Si-fins) formed by the second spacers 107 may have the same size, some elements formed by second spacers 107a will have a smaller spacing, $\gamma'$, resulting in a non-uniform spacing between the adjacent elements. Additionally, the space, $\alpha'$, between the two adjacent mandrels 101 is greater than that of in FIG. 1A resulting in a non-uniform spacing between elements corresponding to the adjacent mandrels.

FIG. 1C illustrates another example where $\alpha'\neq\beta'\neq\gamma$ resulting in a pitch-walking error where $\alpha'$ is greater than $\beta'$ and $\gamma$, and $\gamma$ is greater than $\beta'$. The resulting pitch-walking error can be contributed to different size dummy-spacers 103a when compared to those in FIGS. 1A and 1B. Again, although the elements (e.g. Si-fins) formed by the first-spacers 107 may have the same size, some adjacent elements that may be formed by first-spacers 107b will have a smaller spacing, $\beta'$, resulting in non-uniform spacing between the adjacent elements. Similar to FIG. 1B, the space, $\alpha'$, between the two adjacent mandrels is greater than that of in FIG. 1A resulting in a non-uniform spacing between elements corresponding to the adjacent mandrels.

As a process error, pitch-walking is detrimental to subsequent processes (e.g. patterning) utilized in fabrication of IC devices and various metrology techniques may be utilized to identify and measure variations/errors for adjusting the related processes. However, the current metrology techniques may be inefficient (e.g. slow) and/or may require a combination of different techniques (e.g. hybrid) to accurately identify and measure CDs of features produced by complex multi patterning processes.

Therefore, a need exists for enabling accurate in-line identification, isolation, and measurement of features produced by multi patterning processes and the resulting apparatus.

SUMMARY

An aspect of the present disclosure is a method of enabling in-line metrology solutions for identification and measurement of pitch-walking errors.

An aspect of the present disclosure is an apparatus for enabling in-line metrology solutions for identification and measurement of pitch-walking errors.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure some technical effects may be achieved in part by a method including forming mandrels, in test sites on a substrate, parallel to each other and spaced from each other; performing first and second side wall transfer (SIT) processes, forming first through fourth fins in the substrate for each mandrel; designating spaces between first and second and between third and fourth fins as $\beta$, between first and fourth fins corresponding to adjacent mandrels as $\alpha$, and between second and third fins as $\gamma$ in each test site; applying a first selective lithomask over fins at a first test site selecting first spaces designated as a first one of $\alpha$, $\beta$, or $\gamma$ and the adjacent fins; applying a second selective lithomask over fins at a second test site selecting second spaces, designated as a second one of $\alpha$, $\beta$, or $\gamma$, different from the first one, and the adjacent fins; measuring the first and second spaces selected with the selective first and second lithomasks; determining differences between the measured first spaces and second spaces; and adjusting processes for forming the first through fourth fins based on the determined differences.

Another aspect includes applying a third selective lithomask over fins at a third test site selecting third spaces, designated as a third one of $\alpha$, $\beta$, or $\gamma$, different from the first and second ones, and the adjacent fins; measuring the third spaces selected with the third selective lithomask; determining second and third differences between the measured third spaces and the first spaces, and between the measured third and second spaces, respectively, or a combination thereof; and adjusting the processes for forming the first through fourth fins based on the determined first, second, and third differences.

One aspect includes removing unselected fins in the first, second, and third test sites. An additional aspect includes utilizing averages of the first, second, and third spaces, respectively, in determining the first, second, and third differences.

A further aspect includes adjusting the processes to reduce at least one of the first, second, and third differences. In one aspect, adjusting the processes includes adjusting a width and/or spacing of the mandrels.

In an additional aspect, the first and second SIT processes include forming first spacers at opposite sides of the mandrels; removing the mandrels; forming second spacers at opposite sides of the first spacers; removing the first spacers; etching the substrate between the second spacers; and removing the second spacers; and adjusting the processes includes adjusting a width of the first spacers, second spacers, or mandrels, a spacing of the mandrels, or a combination thereof.

One aspect includes measuring the spaces by CDSEM. In another aspect, each first, second, and third difference is a pitch-walking error.

Another aspect of the present disclosure includes an apparatus including: a substrate having adjacent sets of first through fourth fins formed in the substrate, with spaces between first and second and between third and fourth fins designated as β, between first and fourth fins from adjacent sets designated as α, and between second and third fins designated as γ; first and second test sites each including at least one set of fins; a selective first lithomask over fins at the first test site selecting first spaces designated as a first one of α, β, or γ and the adjacent fins at the first test site; a selective second lithomask over fins at the second test site selecting second spaces, designated as a second one of α, β, or γ, different from the first one, and the adjacent fins at the second test site; a measuring means for measuring the first and second spaces selected with the selective first and second lithomasks; and a comparison means for comparing the measured first and second spaces and determining differences.

Another aspect includes a third test site including at least one set of fins; a third selective lithomask selecting third spaces, designated as a third one of α, β, or γ, different from the first and second ones, and the adjacent fins at the third test site; a measuring means for measuring the third spaces selected with the third selective lithomask; and a comparison means for comparing the measured first and third and between the measured and third and second spaces and determining second and third differences, respectively.

An additional aspect includes means for adjusting processes for forming the sets of fins based on the determined first, second, and third differences. In one aspect, the processes for forming the sets of fins are adjusted to reduce at least one of the first, second, and third differences.

In a further aspect, the process for forming the sets of fins includes forming mandrels on the substrate; forming first spacers at opposite sides of the mandrels; removing the mandrels; forming second spacers at opposite sides of the first spacers; removing the first spacers; etching the substrate between the second spacers; and removing the second spacers; and the means for adjusting the processes includes adjusting a width of the first spacers, second spacers, or mandrels, a spacing of the mandrels, or a combination thereof. In one aspect, the means for measuring includes CDSEM.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A through 1C illustrate example multi patterning processes for forming fin features in a substrate.

DETAILED DESCRIPTION

For the purposes of clarity, in the following description, numerous specific details are set forth to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses the problems of inefficient (e.g. slow) and/or a complicated metrology techniques (e.g. hybrid or requiring data forwarding across multiple process steps) attendant upon measuring pitch walking in patterns produced by multiple patterning lithographically processes. The present disclosure addresses and solves such problems, for instance, by, inter alia, grouping and separating different categories of fin spaces into different areas in a substrate and utilizing one or more metrology techniques to measure and compare the CDs in each group.

Figure 2A:
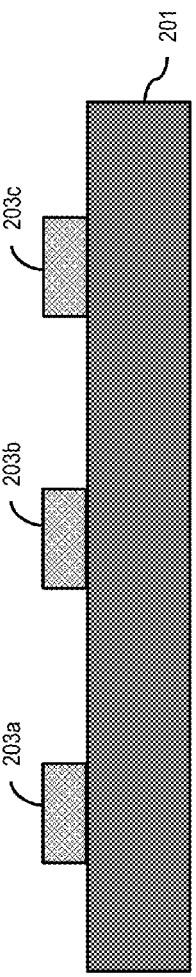
FIGS. 2A through 2R illustrate cross-sectional and top views of processes for generating fin features at different test sites for measuring spaces between adjacent fins, in accordance with an exemplary embodiment.

FIG. 2A illustrates a substrate 201 and mandrels 203a, 203b, 203c parallel to and spaced from each other, respectively, on an upper surface of the substrate 201, which may include a Si layer and one or more hardmask layers thereon. The position and number of the mandrels may vary according to a design, testing, or other criteria associated with fabrication processes of a semiconductor manufacturer.

Figure 2B:
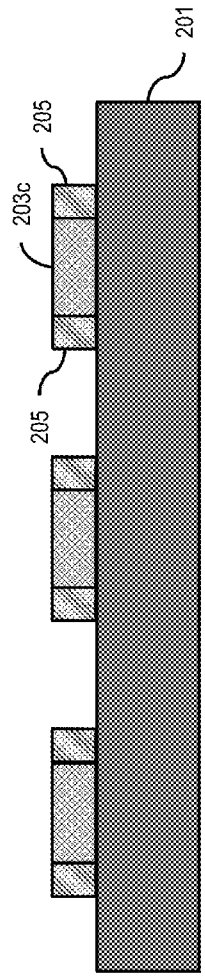
Figure 2C:
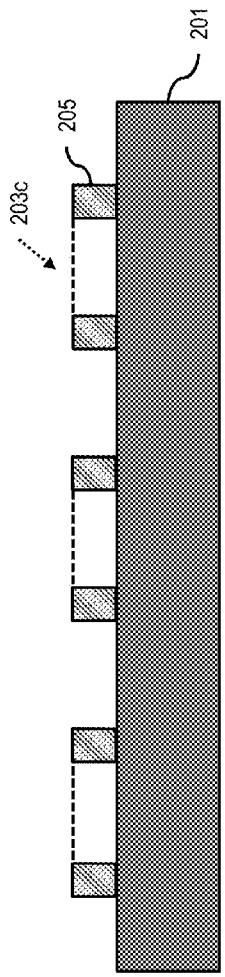
Figure 2D:
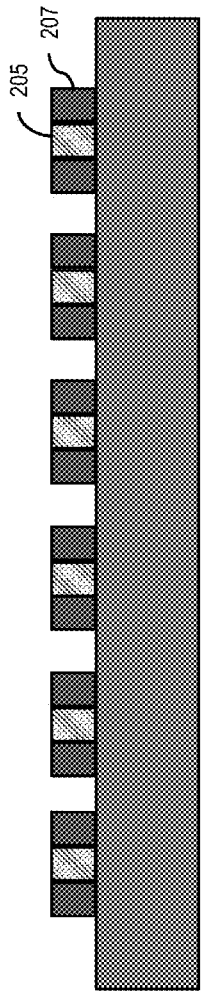

Adverting to FIG. 2B, first spacers 205 (e.g., oxide or nitride) may be formed on opposite sides of each mandrel 203a, 203b, and 203c. In FIG. 2C, the mandrels 203a through 203c are removed leaving the first spacers 205 on the upper surface of the substrate 201. In FIG. 2D, second spacers 207 may be formed on each exposed side of the first spacers 205.

Figure 2E:
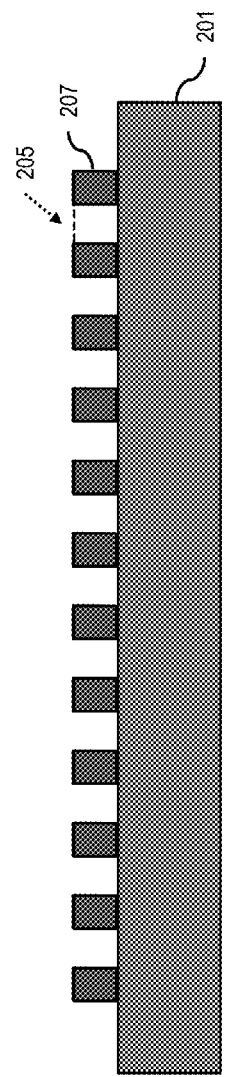
Figure 2F:
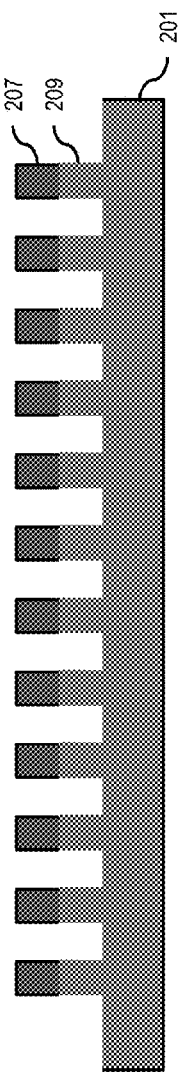

In FIG. 2E, the first spacers 205 may be removed leaving the second spacers 207 on the upper surface of the substrate 201. As illustrated in FIG. 2F, a portion of the substrate 201 between the second spacers 207, is removed (e.g. etched) to form fin features 209 in the substrate 201. The fin features (also referred to as fins) 209 may include the material layers (e.g. Si and hardmask) of the substrate 201.

Adverting to FIG. 2G, the second spacers 207 may be removed to expose the fin features 209, which may be referenced as first 209a, second 209b, third 209c, and fourth 209d fin features in each of groups 211, 213, and 215 of fins, wherein each group corresponds to a different mandrel. A first space between the first and second fin features, 209a/209b, may have a width β; a second space between the second and third fin features, 209b/209c, may have a width γ; a third space between the third and fourth fin features, 209c/209d, may have a width β; and a fourth space between the fourth fin feature, 209d, of one group (e.g. 211) and the first fin feature 209a of an adjacent group (e.g. 213) may have a width α. The widths α, β, γ may be the same or different. Additionally, a cell may include various numbers of fin features, for example, based on design criteria of an IC device.

FIG. 2H, a top view of the cross-sectional view presented in FIG. 2G, illustrates the upper surface of the substrate 201 including the fin features 209 and the spaces α, β, and γ in the adjacent groups 211, 213, and 215. Also illustrated are initial location outlines of the mandrels 203a, 203b, and 203c used in forming of the fin features 209. Cross-sectional views are presented along the cross-sectional reference line 2G-2G'.

Figure 2K:
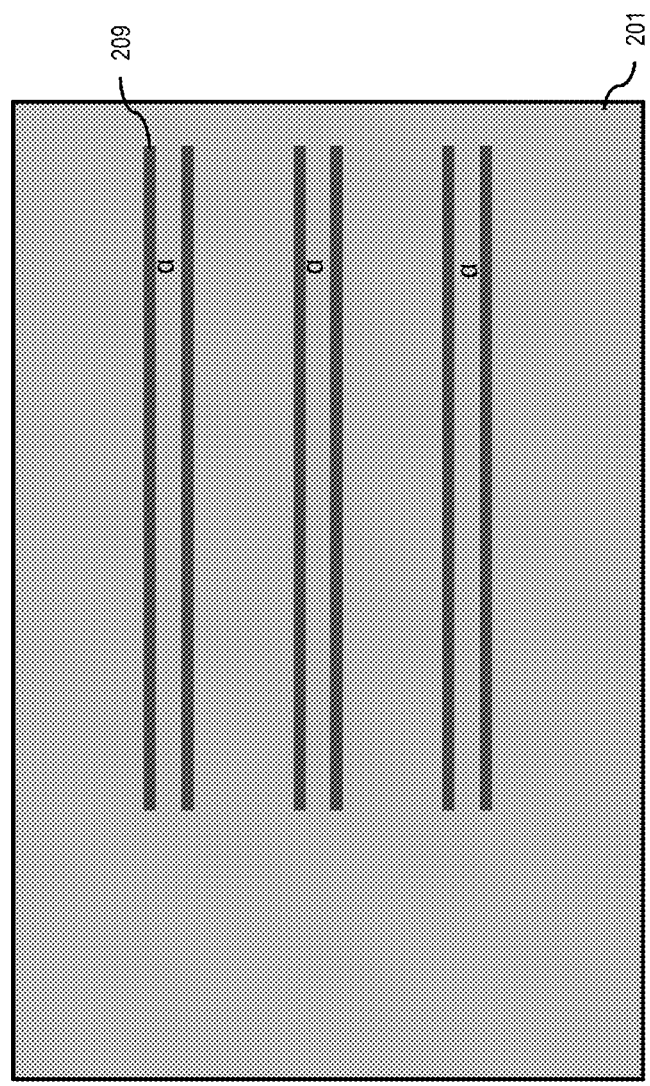

FIGS. 2I and 2J, top and cross-sectional (along line 2J-2J') views, respectively, illustrate adjacent groups 211, 213, 215, and 217 each including first through fourth fin features 209 in a first test site on the substrate 201. A lithomask selecting areas 219, 221, and 223 is applied to select the fourth and first fin features of adjacent groups 211/213, 213/215, and 215/217, respectively. The lithomask may be a block mask or cut mask to block or expose the selected fin features 209 and remove the remaining unselected fin features 209 in the first test area. FIG. 2K illustrates a top view of the selected adjacent fin features 209 with a first space α between the adjacent fin features 209 in the first test site on the upper surface of the substrate 201. One or more metrology techniques may be utilized to measure each first space α as well as determine an average of the first spaces.

Figure 2N:
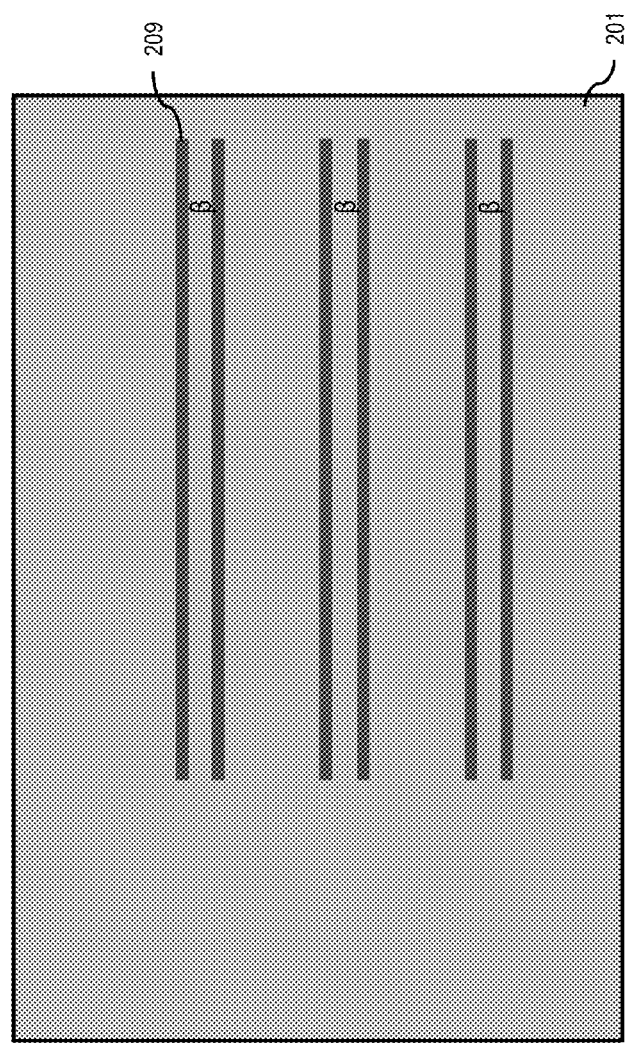

In a second test site, with similar processes as discussed in relation to FIGS. 2I and 2J, FIGS. 2L and 2M illustrate top and cross-sectional (along line 2M-2M') views of the application of a second lithomask selecting areas 225, 227, and 229 in adjacent groups 231, 233, and 235, respectively, to select the third and fourth fin features 209 in each group. The unselected fin features 209 in the second test site are removed. FIG. 2N illustrates a top view of the selected adjacent fin features 209 with a second space β between the adjacent fin features 209 in the second test site. One or more metrology techniques may be utilized to measure each second space β as well as determine an average of the second spaces. In one instance, a metrology technique may be utilized to determine first differences between the measured first spaces and the second spaces for adjusting the first and second SIT processes that are used to form the first through fourth fins based on the determined first differences. For example, a width and/or spacing of the mandrels 203 may be adjusted.

Figures 2O, 2P:
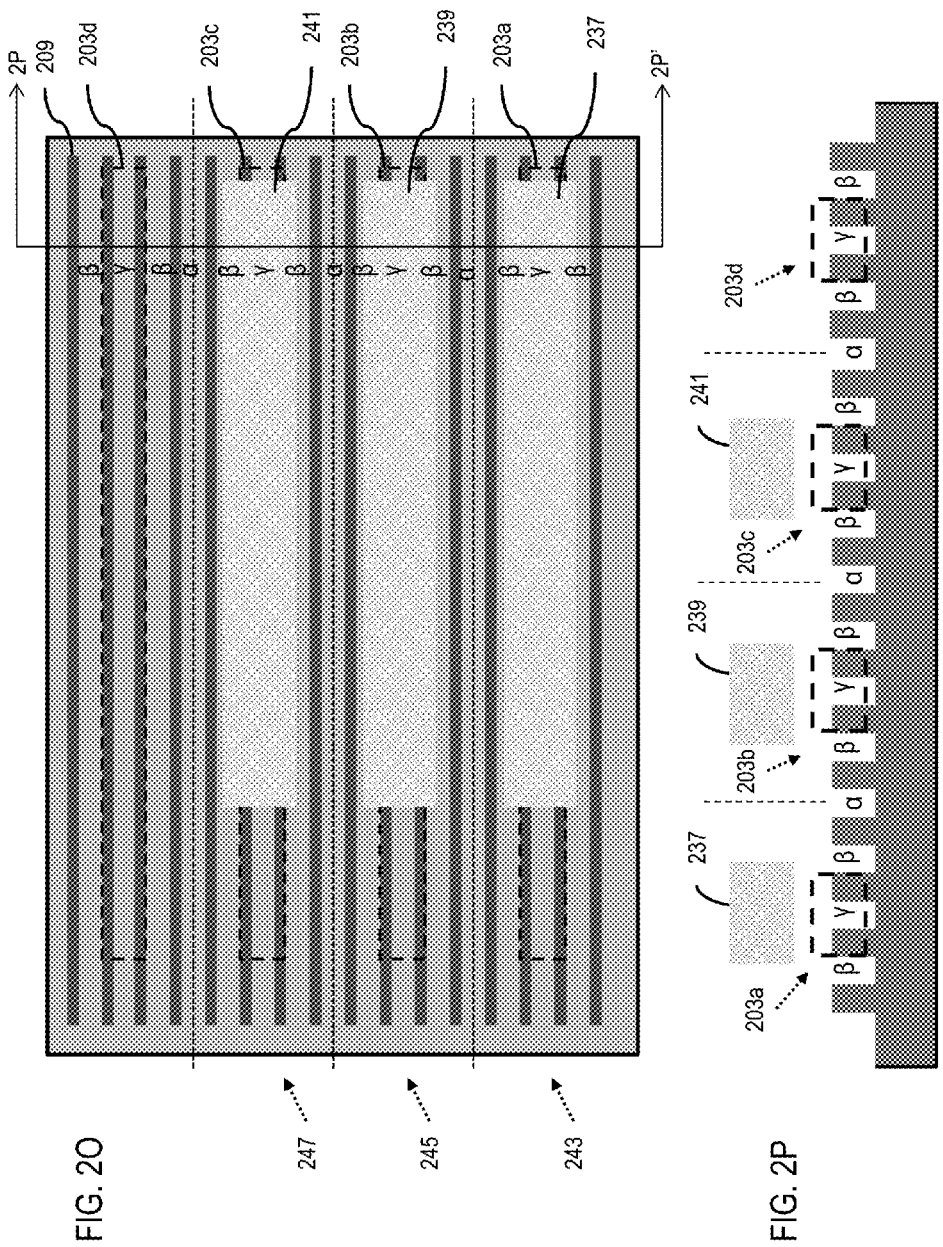
Figure 2Q:
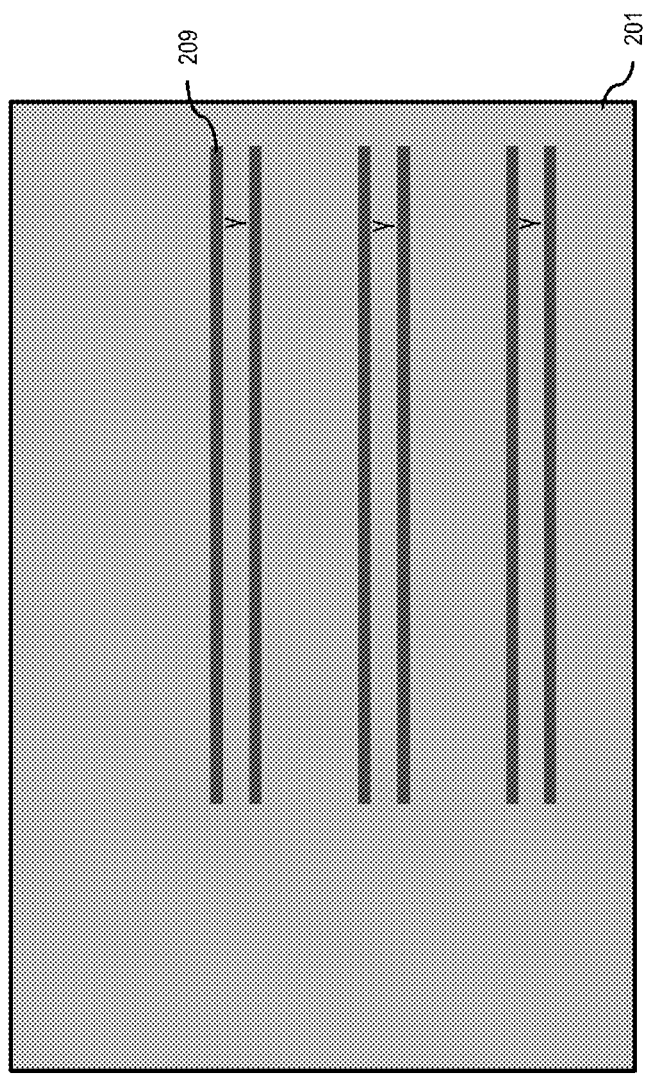

In a third test site, FIGS. 2O and 2P, top and cross-sectional (along line 2P-2P') views, illustrate the application of a third lithomask selecting areas 237, 239, and 241 in adjacent groups 243, 245, and 247, respectively, to select the second and third fin features 209 in each group. The unselected fin features 209 in the third test site are removed. FIG. 2Q illustrates a top view of the selected adjacent fin features 209 with a third space γ between the adjacent fin features 209 in the third test site. One or more metrology techniques may be utilized to measure each third space γ as well as determine an average of the third spaces. For instance, a metrology technique may be utilized to determine second differences between the measured third and first spaces as well as third differences between the measured third and second spaces for adjusting the first and second SIT processes that are used to form the first through fourth fins based on the determined second and third differences. Overall, the SIT processes utilized in the test sites may be adjusted to reduce at least one of the first, second, and third differences.

Adverting to FIG. 2R, the spaces α, β, and γ in the fin feature sets 249, 251, 253, in the first, second, and third test sites, respectively, on the substrate 201, may be measured by use of one or more CD metrology techniques such as scatterometry, scanning electron microscopy (CD-SEM), or the like. At least two of the measurements of the spaces α, β, and γ (e.g. α/β) may be compared to each other, wherein a difference between the compared spaces would indicate a pitch-walking error. Additional combinations of the spaces (e.g., α/γ, β/γ, or α/β/γ) may be compared to determine if a pitch-walking error exists. If the measured spaces are equal, α=β=γ, or substantially the same (e.g. negligible differences within process limitations), then the pitch-walking error may be considered to be zero or negligible.

It is noted that above discussed methods/processes may begin, for example, at FIG. 2I where the fin features 209 may already be formed/provided on a substrate.

The embodiments of the present disclosure can achieve several technical effects including enabling direct measurements of pitch walking using conventional imaging metrology by grouping and separating different category features into different areas in a substrate and viewing and measuring each category feature separately. Furthermore, the embodiments enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or other devices utilizing logic or high-voltage technology nodes. The present disclosure therefore enjoys industrial applicability in any of various types of highly integrated semiconductor devices, including devices that use SRAM cells (e.g., liquid crystal display (LCD) drivers, digital processors, etc.), particularly for the 7 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming mandrels, in test sites on a substrate, parallel to each other and spaced from each other;
   performing first and second side wall transfer (SIT) processes, forming first through fourth fins in the substrate for each mandrel;
   designating spaces between first and second and between third and fourth fins as β, between first and fourth fins corresponding to adjacent mandrels as α, and between second and third fins as γ in each test site;
   applying a first selective lithomask over fins at a first test site selecting first spaces designated as a first one of α, β, or γ and the adjacent fins;

applying a second selective lithomask over fins at a second test site selecting second spaces, designated as a second one of α, β, or γ, different from the first one, and the adjacent fins;

measuring the first and second spaces selected with the selective first and second lithomasks;

determining differences between the measured first spaces and second spaces; and adjusting processes for forming the first through fourth fins based on the determined differences.

2. The method according to claim 1, further comprising:
applying a third selective lithomask over fins at a third test site selecting third spaces, designated as a third one of α, β, or γ, different from the first and second ones, and the adjacent fins;

measuring the third spaces selected with the third selective lithomask;

determining second and third differences between the measured third spaces and the first spaces, and between the measured third spaces and second spaces, respectively, or a combination thereof; and adjusting the processes for forming the first through fourth fins based on the determined first, second, and third differences.

3. The method according to claim 2, further comprising:
removing unselected fins in the first, second, and third test sites.

4. The method according to claim 2, further comprising:
utilizing averages of the first, second, and third spaces, respectively, in determining the first, second, and third differences.

5. The method according to claim 2, comprising:
adjusting the processes to reduce at least one of the first, second, and third differences.

6. The method according to claim 2, wherein adjusting the processes comprises:
adjusting a width and/or spacing of the mandrels.

7. The method according to claim 2, wherein
the first and second SIT processes comprise:
forming first spacers at opposite sides of the mandrels;
removing the mandrels;
forming second spacers at opposite sides of the first spacers;
removing the first spacers;
etching the substrate between the second spacers; and
removing the second spacers; and
adjusting the processes comprises:
adjusting a width of the first spacers, second spacers, or mandrels, a spacing of the mandrels, or a combination thereof.

8. The method according to claim 1, comprising measuring the spaces by CDSEM.

9. The method according to claim 2, wherein each first, second, and third difference is a pitch-walking error.

10. An apparatus comprising:
a substrate having adjacent sets of first through fourth fins formed in the substrate, with spaces between first and second and between third and fourth fins designated as β, between first and fourth fins from adjacent sets designated as α, and between second and third fins designated as γ;

first and second test sites each including at least one set of fins;

a selective first lithomask over fins at the first test site selecting first spaces designated as a first one of α, β, or γ and the adjacent fins at the first test site;

a selective second lithomask over fins at the second test site selecting second spaces, designated as a second one of α, β, or γ, different from the first one, and the adjacent fins at the second test site;

a measuring means for measuring the first and second spaces selected with the selective first and second lithomasks; and a comparison means for comparing the measured first and second spaces and determining differences.

11. The apparatus according to claim 10, further comprising:
a third test site including at least one set of fins;
a third selective lithomask selecting third spaces, designated as a third one of α, β, or γ, different from the first and second ones, and the adjacent fins at the third test site;

a measuring means for measuring the third spaces selected with the third selective lithomask; and a comparison means for comparing the measured first and third and between the measured third and second spaces and determining second and third differences, respectively.

12. The apparatus according to claim 11, further comprising:
means for adjusting processes for forming the sets of fins based on the determined first, second, and third differences.

13. The apparatus according to claim 12, wherein the processes for forming the sets of fins are adjusted to reduce at least one of the first, second, and third differences.

14. The apparatus according to claim 12, wherein
the process for forming the sets of fins comprises:
forming mandrels on the substrate;
forming first spacers at opposite sides of the mandrels;
removing the mandrels;
forming second spacers at opposite sides of the first spacers;
removing the first spacers;
etching the substrate between the second spacers; and
removing the second spacers; and
the means for adjusting the processes comprises:
adjusting a width of the first spacers, second spacers, or mandrels, a spacing of the mandrels, or a combination thereof.

15. The apparatus according to claim 10, wherein the means for measuring comprises CDSEM.

16. A method comprising:
forming mandrels in test sites on a silicon (Si) layer, parallel to each other and spaced from each other;
performing first and second side wall transfer (SIT) processes, forming first through fourth fins in the substrate for each mandrel;
designating spaces between first and second and between third and fourth fins as β, between first and fourth fins as α, and between second and third fins as γ in each test site;

applying a first selective lithomask over fins at a first test site selecting first spaces designated as a first one of α, β, or γ and the adjacent fins;

applying a second selective lithomask over fins at a second test site selecting second spaces, designated as a second one of α, β, or γ, different from the first one, and the adjacent fins;

applying a third selective lithomask over fins at a third test site selecting third spaces, designated as a third one of α, β, or γ, different from the first and second ones, and the adjacent fins;

removing unselected fins in the first, second, and third test sites;

measuring the first, second, and third spaces selected with the selective first, second, and third lithomasks by CDSEM;

determining first differences between the measured first spaces and the second spaces;

determining second and third differences between the measured third and first spaces and between the measured third and second spaces, respectively, or a combination thereof; and adjusting processes for forming the first through fourth fins based on the determined first, second, and third differences.

17. The method according to claim 16, further comprising:

utilizing averages of the first, second, and third spaces, respectively, in determining the first, second, and third differences.

18. The method according to claim 16, comprising:

adjusting a width and/or spacing of the mandrels to reduce at least one of the first, second, and third differences.

19. The method according to claim 16, wherein the first and second SIT processes comprise:

forming first spacers at opposite sides of the mandrels;

removing the mandrels;

forming second spacers at opposite sides of the first spacers;

removing the first spacers;

etching the substrate between the second spacers; and removing the second spacers; and adjusting the processes comprises:

adjusting a width of the first spacers, second spacers, or mandrels, a spacing of the mandrels, or a combination thereof.

20. The method according to claim 16, wherein each first, second, and third difference is a pitch-walking error.

* * * * *